US011125504B2

(12) United States Patent
Moon et al.

(10) Patent No.: US 11,125,504 B2
(45) Date of Patent: Sep. 21, 2021

(54) COLD CRUCIBLE STRUCTURE

(71) Applicant: KOREA INSTITUTE OF INDUSTRIAL TECHNOLOGY, Cheonan-si (KR)

(72) Inventors: Byung Moon Moon, Seoul (KR); Hyun Jae Lee, Incheon (KR); Hyun Do Jung, Incheon (KR)

(73) Assignee: Korea Institute of Industrial Technology, Cheonan-si (KR)

( * ) Notice: Subject to any disclaimer, the term of this patent is extended or adjusted under 35 U.S.C. 154(b) by 203 days.

(21) Appl. No.: 16/205,154

(22) Filed: Nov. 29, 2018

(65) Prior Publication Data

US 2020/0173723 A1 Jun. 4, 2020

(51) Int. Cl.
| | | |
|---|---|---|
| H05B 6/22 | (2006.01) |
| F27B 14/06 | (2006.01) |
| C22B 34/12 | (2006.01) |
| C22B 9/00 | (2006.01) |
| H05B 6/24 | (2006.01) |
| C30B 15/10 | (2006.01) |

(52) U.S. Cl.
CPC .............. *F27B 14/06* (2013.01); *C22B 9/003* (2013.01); *C22B 34/1295* (2013.01); *C30B 15/10* (2013.01); *H05B 6/24* (2013.01)

(58) Field of Classification Search
CPC ...... F27B 14/06; F27B 14/061; F27B 14/063; F27B 14/10; F27B 14/14; C22B 9/003; C22B 9/04; C22B 9/16; C22B 34/1295; C22B 34/14; C22B 34/24; C22B 34/32; C22B 34/34; C30B 15/10; H05B 6/22; H05B 6/24; H05B 6/32; H05B 6/36; H05B 6/367; H05B 6/42; F27D 9/00

USPC ....... 373/138, 140, 146, 149, 151, 153, 154, 373/155, 156, 157, 158
See application file for complete search history.

(56) References Cited

U.S. PATENT DOCUMENTS

| | | | | |
|---|---|---|---|---|
| 5,892,790 A | * | 4/1999 | Abiko | F27B 14/063 373/158 |
| 6,798,821 B2 | * | 9/2004 | Lian | F27B 14/04 373/156 |
| 2013/0067959 A1 | * | 3/2013 | Lee | C30B 13/14 65/355 |

FOREIGN PATENT DOCUMENTS

FR       2548856 A1 * 1/1985 ............... H05B 6/22

* cited by examiner

*Primary Examiner* — Hung D Nguyen
(74) *Attorney, Agent, or Firm* — Rabin & Berdo, P.C.

(57) ABSTRACT

A cold crucible structure according to an embodiment of the present invention includes a cold crucible structure according to an embodiment of the present invention includes: a cold crucible unit including hollow top and bottom caps, a plurality of segments connecting the top cap and the bottom cap, slits disposed between the segments, and a reaction area surrounded by the segments; and an induction coil unit disposed to cover the outer side of the cold crucible unit and disposed across the longitudinal directions of the segments and the slits, in which the diameter of the reaction area is defined as a crucible diameter, the crucible diameter is 100 to 300 mm, and a width of each of the slits is defined by $$d_{slit} \leq 0.3 \times \frac{\emptyset}{50}$$

(mm)(where $d_{slit}$ is the width of each of the slits and $\emptyset$ is the crucible diameter).

11 Claims, 13 Drawing Sheets

COLD CRUCIBLE STRUCTURE

TECHNICAL FIELD

The present invention relates to a cold crucible structure, and more particularly, to a cold crucible structure that has mechanical, structural, and thermal stability and increases melting efficiency.

BACKGROUND ART

High-melting point active metal such as titanium is applied to a broad field including fine chemical, aerospace, automobile, defense, and medical instrument fields that are the fundament of the industry of a country.

A crucible is used to melt such high-melting point active metal. In general, indirect heating that melts substances by induction-heating a crucible that has a melting point very higher than those of the substances to be melted is used to melt not only high-melting point active metal, but other substances. This method requires a crucible that is very higher in melting point than substances to melt, so impurities may be contained in the molten substances due to chemical reactions between the crucible and the high-temperature molten substances and the crucible may be vulnerable. Further, this defect may be worsened when dissolving high-melting point active metal such as titanium.

Accordingly, a cold crucible melting method can be used to efficiently melt high-melting point active metal such as titanium.

The cold crucible melting method enables a substance to be melted to function as the inner wall of a crucible by inducing the substance to be melted. Since the cold crucible melting method directly heat substances to be melted, it is also called direct heating. The cold crucible melting method uses a container formed by a double tube, and heats a high-melting point substance to be melted using induction heating by putting the substance into the container and then circulating cooling water. According to this induction heating method, the outer wall of a molten substance is cooled, so a sintered layer is formed by powder and the molten substance between the molten substance and the cold crucible made of a tube, thereby functioning as a container. The melting method using a cold crucible can keep the purity of the substance to be melted, so it is one of methods that are used for high-purity crystalline growth. Further, it is considered as being very efficient when melting high-melting point active metal such as titanium.

However, crucibles that are used in the melting method using a cold crucible are designed in consideration of only mechanical/thermal stability, so a magnetic field penetration ratio, energy efficiency, and melting efficiency are low.

Therefore, it is required to standardize design factors for improving a magnetic field penetration ratio, energy efficiency, and melting efficiency while maintaining the mechanical/thermal stability of cold crucibles.

SUMMARY OF INVENTION

Technical Problem

An object of the present invention is to provide a cold crucible structure that can improve magnetic field penetration efficiency, dissolution efficiency, and energy efficiency together with mechanical/thermal stability by optimizing the spacing distance between an induction coil unit and a top cap or a bottom cap.

The objects to implement in the present invention are not limited to the technical problems described above and other objects that are not stated herein will be clearly understood by those skilled in the art from the following specifications.

Solution to Problem

In order to achieve the objects, a cold crucible structure according to an embodiment of the present invention includes: a cold crucible unit including hollow top and bottom caps, a plurality of segments connecting the top cap and the bottom cap, slits disposed between the segments, and a reaction area surrounded by the segments; and an induction coil unit disposed to cover the outer side of the cold crucible unit and disposed across the longitudinal directions of the segments and the slits, in which the diameter of the reaction area is defined as a crucible diameter, the crucible diameter is 100 to 300 mm, and a width of each of the slits is defined by the following Equation 1.

$$d_{slit} \leq 0.3 \times \frac{\emptyset}{50} (mm) \quad \text{[Equation 1]}$$

where $d_{slit}$ is the width of each of the slits and $\emptyset$ is the crucible diameter.

The thickness of the segments is set in the range of 15 to 25 mm, and the number of the slits is defined by the following Equation 2.

$$n_{slit} \leq \frac{\pi \emptyset}{d_{thick}} \quad \text{[Equation 2]}$$

where $n_{slit}$ is the number of the slits, $d_{thick}$ is the thickness of the segments, and $\emptyset$ is the crucible diameter.

The cold crucible structure of claim 1, wherein the induction coil unit is the upper end and the lower end of the induction coil unit are spaced apart from the top cap and the bottom cap, respectively, the ratio of the length of the slit/the height of the induction coil is set in the range of $$\frac{h_{slit}}{h_{coil}} 1.5 \sim 3$$

(where hslit is the length of the slits and hcoil is the height of the induction coil unit), and the upper end and the lower end are spaced a predetermined distance apart from the upper portion and the lower portion of the cold crucible, respectively.

The induction coil unit may be disposed at the central area in the longitudinal direction of the segments.

The widths of the slits may be set in the range of 0.3 to 4 mm.

The cold crucible may include cooling channels disposed in the segments and the diameter of the cooling channels may be set in the range of 8 to 15 mm.

The cold crucible structure may further include: a support connected to the bottom cap; and cooling tubes for supplying cooling water for cooling the segments through the support, in which the cooling tubes are connected to the cooling channels.

The cooling channels each may have an inlet channel for supplying cooling water and an outlet channel for discharging cooling water.

The thickness of the segments may be set in the range of 15 to 25 mm.

Fifteen to sixty slits may be disposed in the cold crucible unit.

The shortest spacing distance between ends of the slits and the induction coils and the shortest spacing distance between the other ends of the slits and the induction coil unit may be the same.

Advantageous Effects of Invention

According to an embodiment of the present invention, it is possible to improve magnetic field penetration efficiency, dissolution efficiency, and energy efficiency together with mechanical/thermal stability of the cold crucible structure by optimizing the spacing distance between an induction coil unit and a top cap or a bottom cap.

According to an embodiment of the present invention, it is possible to improve magnetic field penetration efficiency, dissolution efficiency, and energy efficiency together with mechanical/thermal stability of the cold crucible structure by optimizing the crucible diameter, the crucible thickness, the diameter of the cooling channels, the widths of the slits, and the number of the slits.

The effects of the present invention are not limited thereto and it should be understood that the effects include all effects that can be inferred from the configuration of the present invention described in the following specification or claims.

DESCRIPTION OF EMBODIMENTS

Figure 1:
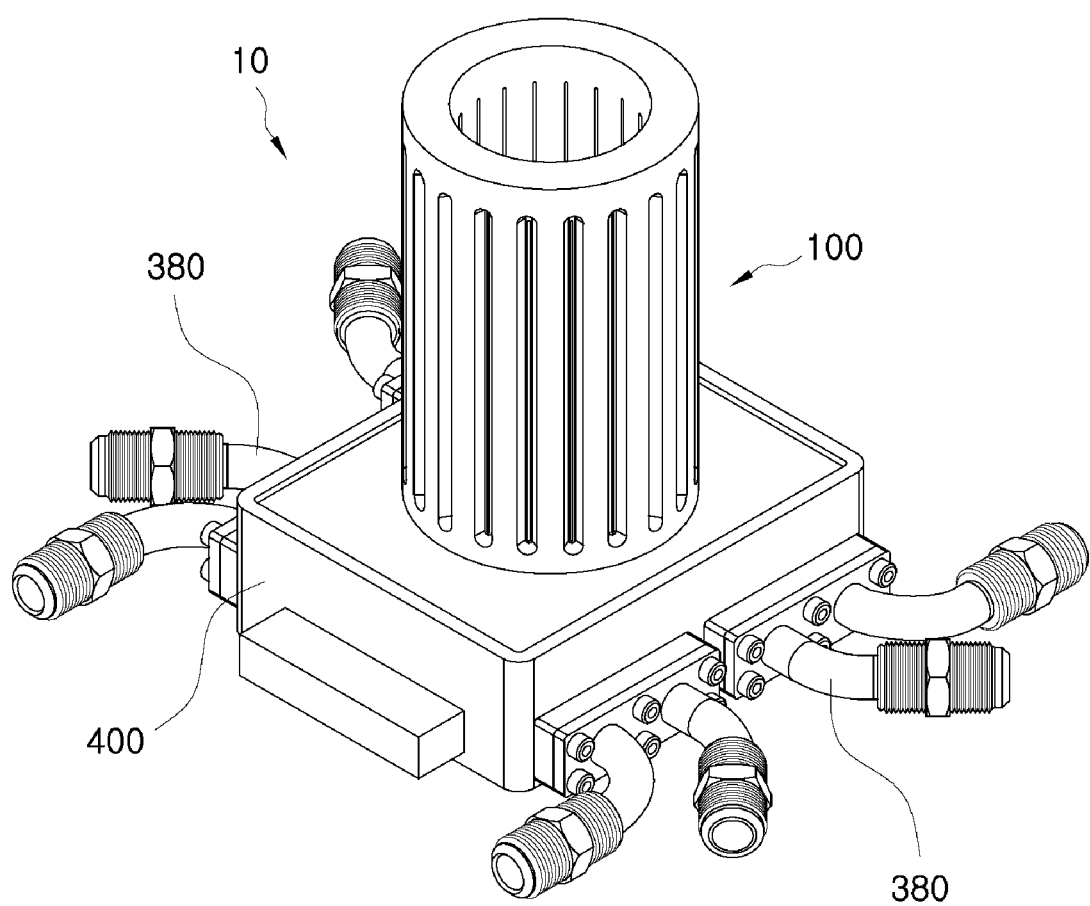
FIG. 1 is a schematic perspective view of a cold crucible structure according to an embodiment of the present invention.

Hereinafter, the present invention is described with reference to the accompanying drawings. However, the present invention may be modified in various different ways and is not limited to the embodiments described herein. Further, in the accompanying drawings, components irrelevant to the description will be omitted in order to obviously describe the present invention, and similar reference numerals will be used to describe similar components throughout the specification.

Throughout the specification, when an element is referred to as being "connected with (coupled to, combined with, in contact with)" another element, it may be "directly connected" to the other element and may also be "indirectly connected" to the other element with another element intervening therebetween. Further, unless explicitly described otherwise, "comprising" any components will be understood to imply the inclusion of other components rather than the exclusion of any other components.

Terms used in the present invention are used only in order to describe specific exemplary embodiments rather than limiting the present invention. Singular forms are intended to include plural forms unless the context clearly indicates otherwise. It will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

Hereinafter, embodiments are described in detail with reference to the accompanying drawings.

Figure 2:
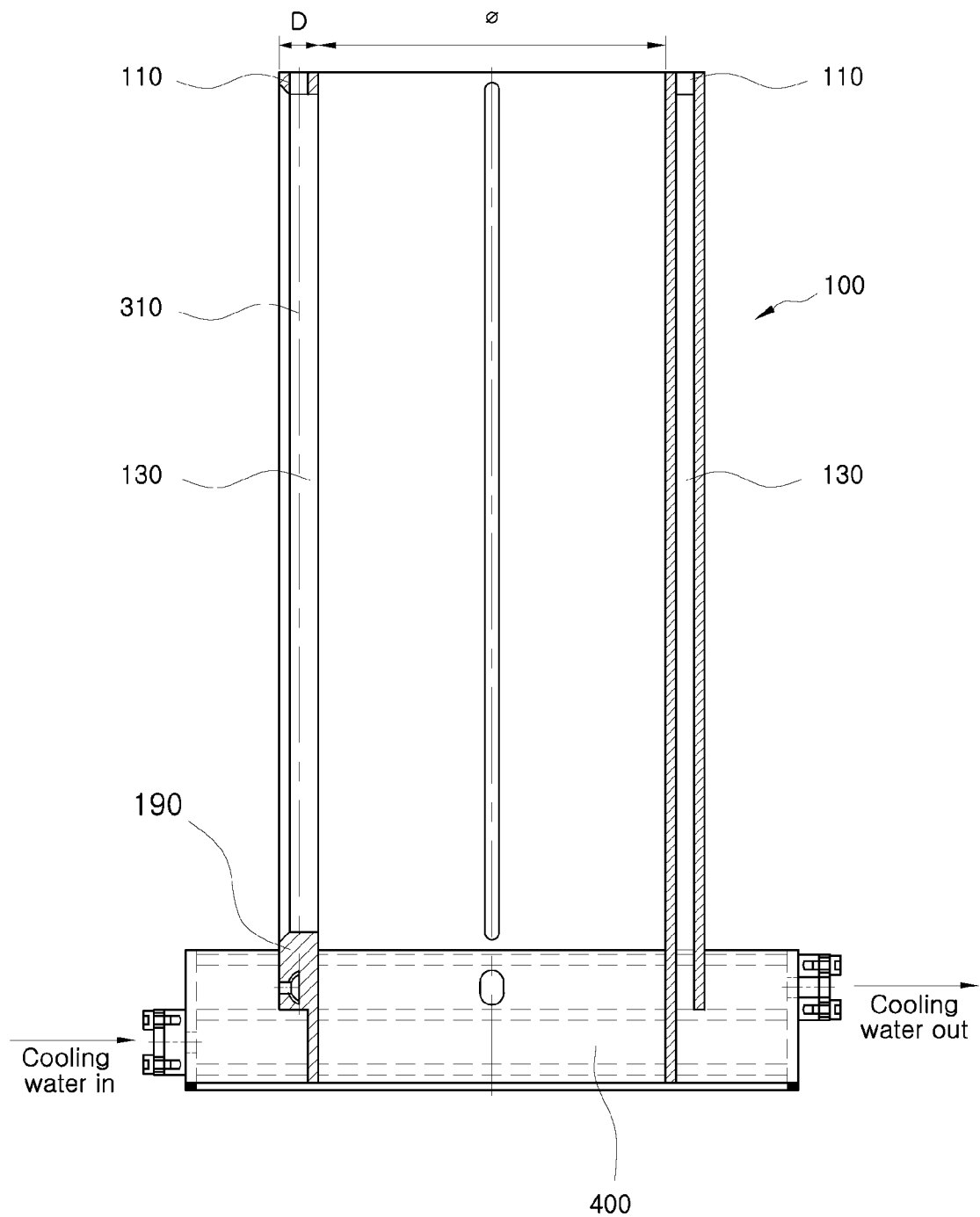
FIG. 2 is a cross-sectional view of the cold crucible structure according to an embodiment of the present invention.
Figure 3:
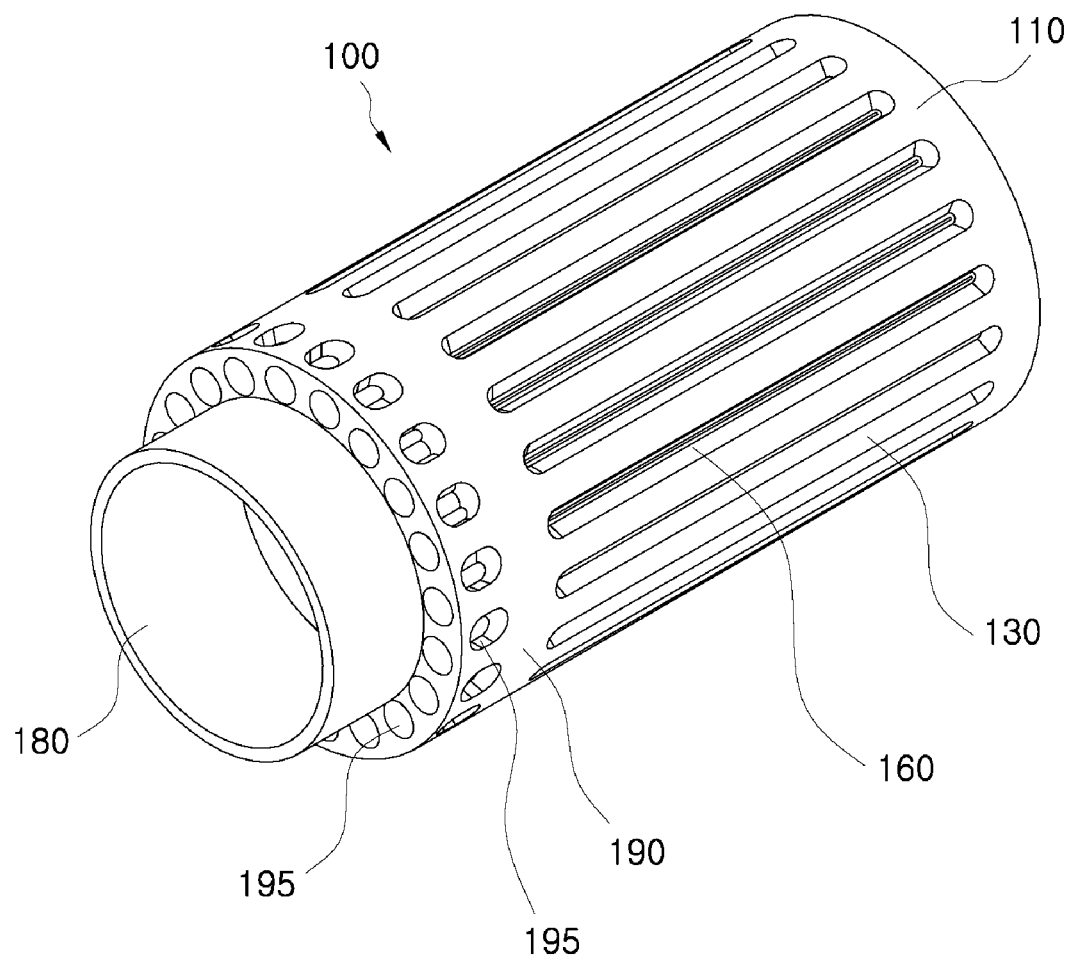
FIG. 3 is a perspective view showing a cold crucible unit of the cold crucible structure according to an embodiment of the present invention.

FIG. 1 is a schematic perspective view of a cold crucible structure according to an embodiment of the present invention, FIG. 2 is a cross-sectional view of the cold crucible structure according to an embodiment of the present invention, and FIG. 3 is a perspective view showing a cold crucible unit of the cold crucible structure according to an embodiment of the present invention.

An induction coil unit 210 of a cold crucible structure 10 is not shown in FIGS. 1 to 3 for convenience of description and an assembly of the induction coil unit and the cold crucible unit 100 will be described in detail below with reference to figures showing the assembly.

Referring to FIGS. 1 to 3, the cold crucible structure 10 according to an embodiment of the present invention includes a cold crucible unit 100, cooling tubes 380, and a support 400.

The cold crucible unit 100 includes a top cap 110 and a bottom cap 190. The top cap 110 and the bottom cap 190 may be formed in hollow shapes. For example, the top cap 110 and the bottom cap 190 may be formed in ring shapes for mechanical/thermal stability of the cold crucible unit 100.

Ring shapes are exemplified for the top cap 110 and the bottom cap 190, but they may be formed in any shape such as a rectangular ring shape and an octagonal ring shape as long as they can pass substances.

The top cap 110 and the bottom cap 190 may be given predetermined thicknesses for mechanical/thermal stability. For the convenience of description, assuming that the top cap 110 and the bottom cap 190 each have a thickness Defined by an inner diameter and an outer diameter, the top cap 110 and the bottom cap 190 may be given a thickness the same as or larger than the thickness of a segment 130. In other words, the top cap 110 and the bottom cap 190 may have thicknesses larger than the thickness D of the segment 130 to be combined with the segment 130 or may have the same thickness when they are formed in a single unit. The thickness D of the segment is the same as the thickness of the crucible, the thickness of the segment is representatively used herein. The optimal value of the thickness D of the segment will be described below.

The cold crucible unit 100 may have a plurality of segments connecting the top cap 110 and the bottom cap 190. The segments 130 and the top/bottom caps 110 and 190 may be independently disposed or may be integrated. In the present embodiment, they are assumed as being integrated.

The segments 130 are formed to correspond to the top cap 110 and the bottom cap 190, thereby being able to form a cylindrical space. The inside of the cylindrical shape can define a reaction area of the cold crucible unit 100. A target substance can be dissolved in the reaction area. The reaction area has the same diameter as a crucible diameter Ø, so the diameter Ø of the crucible is representatively used.

It is important to increase a product by dissolving a large amount of target substance to increase output, but it is preferable that the crucible diameter Ø is 100 to 300 mm in consideration of dissolution efficiency and energy efficiency of the cold crucible structure 10.

Slits 160 may be disposed between the segments 130. The silts 160 may be made of an insulating material. The slits 160 can improve magnetic flux density by improving magnetic field penetration ratio of the segments 130.

The support 400 of the cold crucible structure 10 can support/fix the cold crucible unit 100. A coupling portion 180 for coupling to the support 400 may be formed on the bottom cap 190 of the cold crucible unit 100.

The cooling tubes 380 may be disposed in the support 400. The cooling tubes 380 each may have a cooling water supply portion for supplying cooling water to cooling channels 310 of the segments 130 and a cooling water discharge portion for discharging the cooling water that has cooled the cold crucible unit 100.

The cooling tubes 380 can be connected to the cooling channels 310 formed in the segments 130. The cooling channels 310 are connected to cooling water holes 195 formed in the segments 130 and arranged in the lower portion of the bottom cap 190.

The cooling water holes 195 can be disposed between the bottom cap 190 and the coupling portion 180. The cooling water holes 195 are connected to the cooling tubes 380 and supply cooling water to the cooling channels 310, that is, the cold crucible unit 100, thereby being able to cool the cold crucible unit 100.

As described above, the cold crucible structure 10 can cool the cold crucible unit 100 and the crucible diameter ø in the space defined inside the segments 130 are given as 100 to 300, whereby it is possible to secure mechanical/thermal stability of the cold crucible structure 10 and improve magnetic field penetration ratio and dissolution efficiency.

Figure 4:
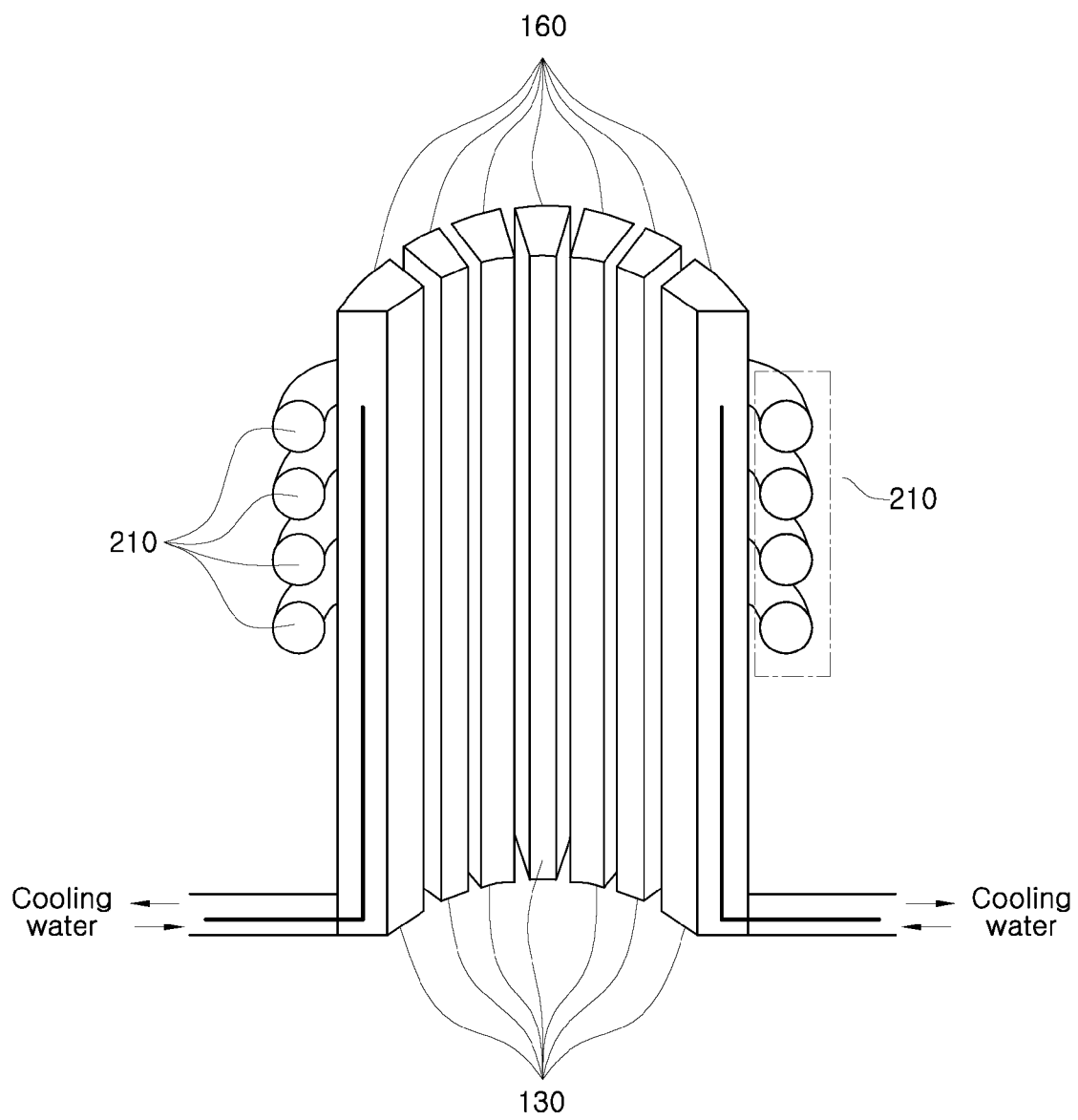
FIG. 4 is a perspective cross-sectional view of an assembly of an induction coil unit and the cold crucible unit of the cold crucible structure according to an embodiment of the present invention.
Figure 5:
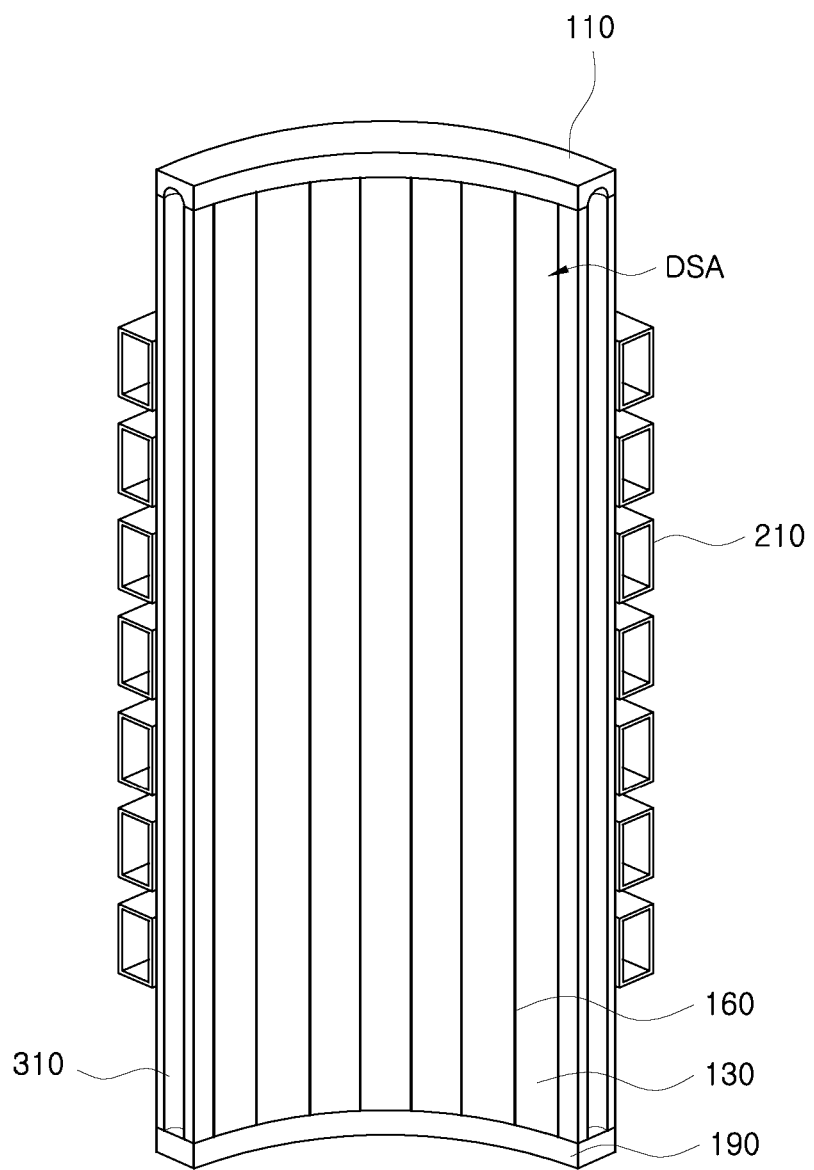
FIG. 5 is a perspective cross-sectional view of the cold crucible structure according to an embodiment of the present invention.
Figure 6:
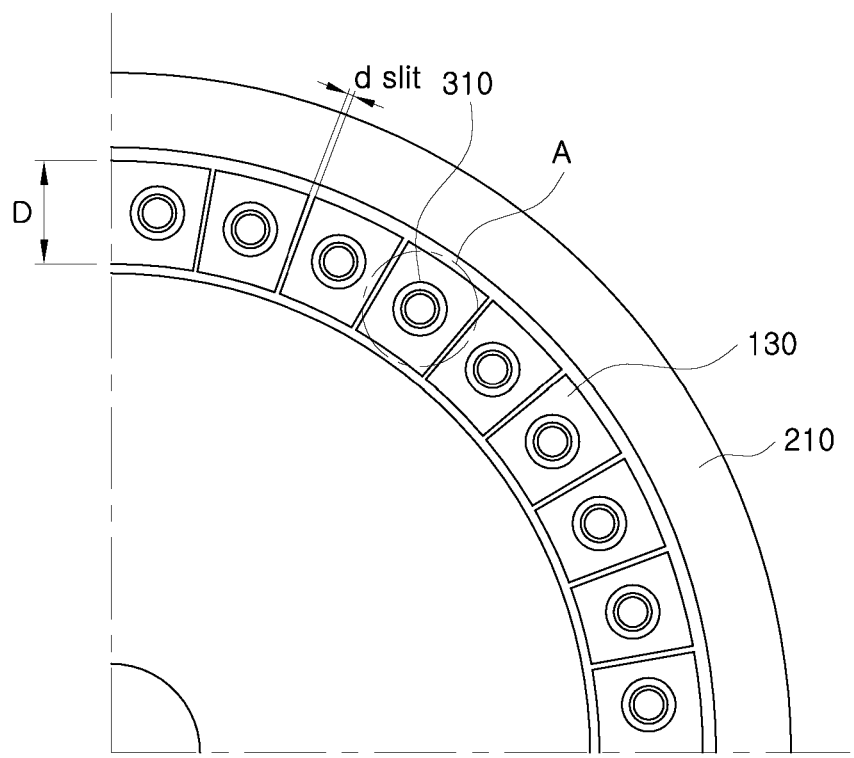
FIG. 6 is a plan view of the cold crucible structure according to an embodiment of the present invention.
Figure 7:
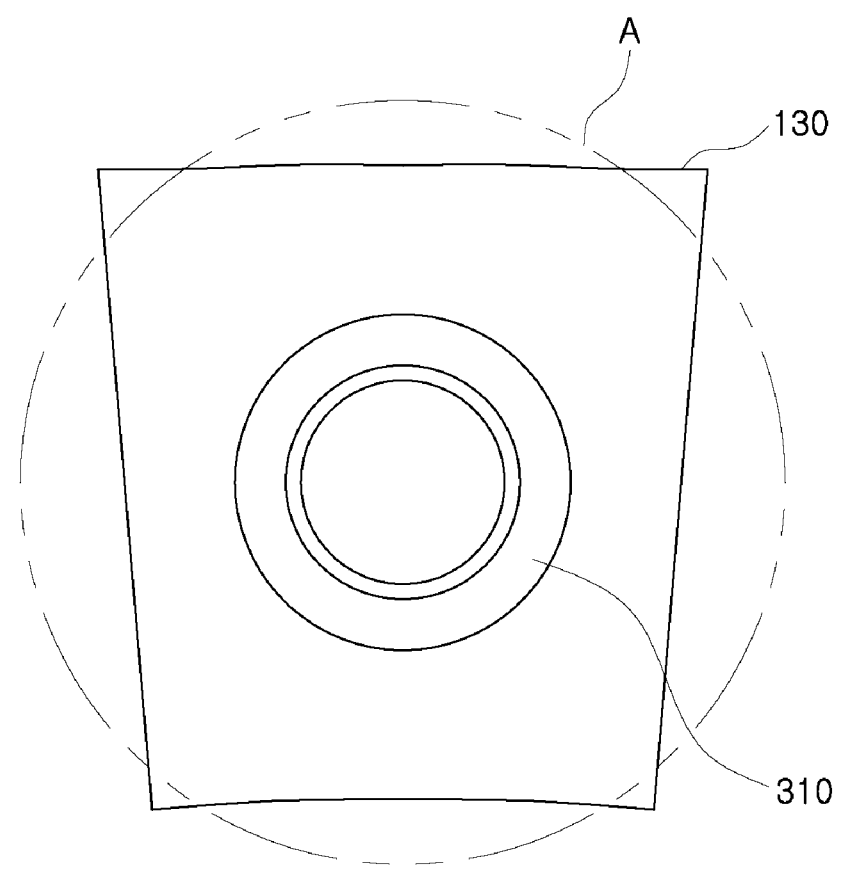
FIG. 7 is an enlarged plan view of the portion A of FIG. 6.

FIG. 4 is a perspective cross-sectional view of an assembly of an induction coil unit and the cold crucible of the cold crucible structure according to an embodiment of the present invention, FIG. 5 is a perspective cross-sectional view of the cold crucible structure according to an embodiment of the present invention, FIG. 6 is a plan view of the cold crucible structure according to an embodiment of the present invention, and FIG. 7 is an enlarged plan view of the portion A of FIG. 6.

Description about FIGS. 4 to 7 refers to FIGS. 1 to 3 to avoid repeated description and explain easily.

Referring to FIGS. 4 to 5, the cold crucible structure 10 according to an embodiment of the present invention includes an induction coil unit 210 disposed across the longitudinal direction of the segments 130 of the cold crucible unit 100.

The induction coil unit 210 can be disposed around the outer side of the cold crucible unit 100. The area of the cold crucible unit 100 covered with the induction coil unit 210 is defined as a dissolution area (DSA). The outermost induction coil unit 210 in the dissolution area (DSA) and the ends of the slits 160 may be spaced a predetermine distance apart from each other.

The slits 160 may be disposed between the segments 130. The slits 160 can space the segments 130 and the cooling channels 310 may be disposed in the segments 130.

Referring to FIGS. 6 and 7, the cold crucible structure 10 has the segments 130. As described above, the segments 130 can define the reaction area where a product can be produced by reaction of a target substance. The segments 130 for defining the reaction area should be given a predetermined thickness to be able to secure mechanical/thermal stability of the cold crucible unit 100.

Accordingly, magnetic flux density was measured using a cold crucible structure having a crucible diameter Ø of 200 to find out the optimal thickness D of the segments 130.

Figure 8:
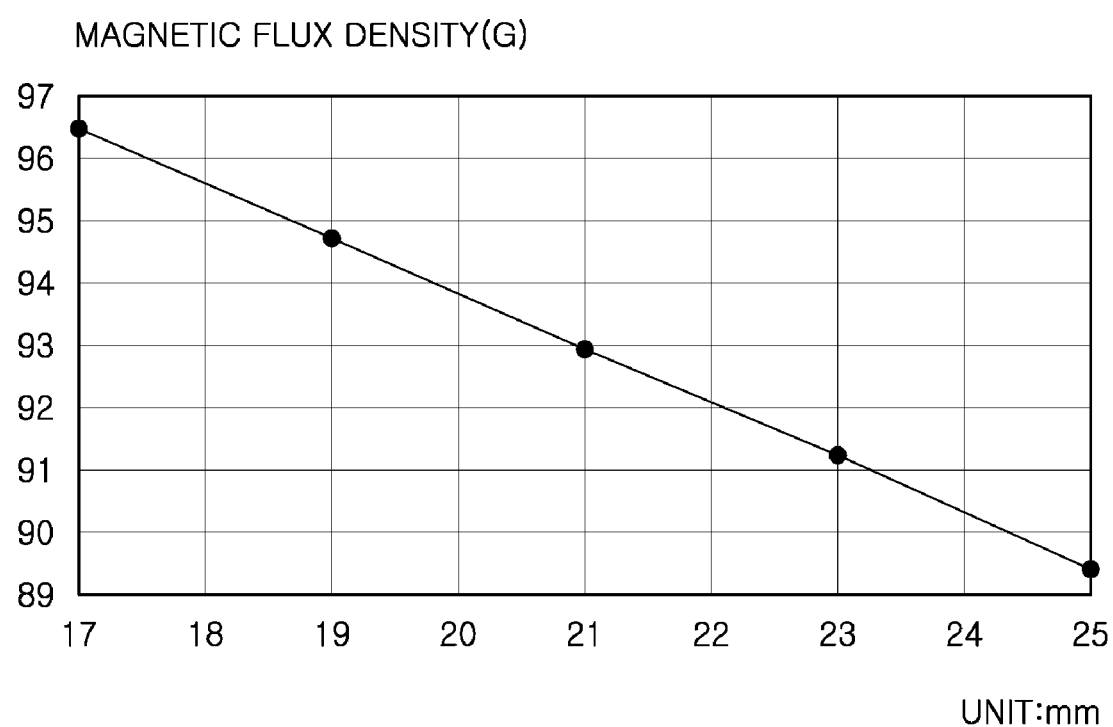
FIG. 8 is a graph showing a change of a magnetic flux density according to the thickness of segments of the cold crucible structure according to an embodiment of the present invention.

FIG. 8 is a graph showing a change of a magnetic flux density according to the thickness D of the segments of the cold crucible structure according to an embodiment of the present invention. A change in magnetic flux density according to the thickness of the segments was measured while changing the thickness D of the segments.

Referring to FIG. 8, it was found out that the larger the thickness D of the segments 130, the lower the magnetic flux density of the cold crucible structure 10. In other words, the larger the thickness D of the segments 130, the lower the magnetic flux density, which may cause energy efficiency and dissolution efficiency.

In detail, when the thickness D of the segments 130 is increased to secure mechanical/thermal stability, the magnetic field penetration ratio of the segments 130 is reduced, so the magnetic flux density may be decreased. Accordingly, it may be a factor that reduces the dissolution efficiency and the energy efficiency of the cold crucible structure 10. In other words, the smaller the thickness of the segments 130, the larger the magnetic field penetration ratio can be, so the dissolution efficiency of the cold crucible structure 10 can be improved.

Accordingly, it is preferable to set the thickness D of the segments 130 such that magnetic flux density of 90 G or more is generated, in consideration of the energy efficiency and the dissolution efficiency of the cold crucible structure 10. As shown in FIG. 8, it can be seen that the magnetic flux density of 90 G or more is generated when the thickness D of the segments 130 is in the range of 15 to 25 mm, so the energy efficiency and dissolution efficiency are improved.

When the crucible diameter Ø is 200 mm, it can be determined that when the thickness D of the segments is in the range of 16 to 19 mm, these are optimal thicknesses, considering mechanical stability, magnetic flux penetration efficiency, and energy efficiency.

When the crucible diameter Ø is 100 or 300 mm, the magnetic flux density may depend on the thickness D of the segments 130, so it is preferable to change the thickness D of the segments 130 in accordance with the crucible diameter Ø.

Accordingly, it is preferable to improve the size of the cooling channels 310, mechanical stability, and dissolution efficiency by setting the thickness D of the segments 130 in the range of 15 to 25 mm in consideration of these conditions.

Referring back to FIGS. 6 and 7, the cooling channel 310 may be disposed in each of the segments 130. The cooling channels 310 may have an inlet channel and an outlet channel. The inlet channels are passages through which cooling water for cooling the crucible unit 100 flows inside and may be disposed close to the segments. The outlet channels are passages for discharging the cooling water that finishes cooling. The inlet channels and the outlet channels can be separated by disposing pipes between them.

The cooling channels 310 should have a predetermined size to cool the cold crucible unit 100. In other words, when the sizes of the cooling channels 310 are increased, supply of cooling water is increased, so the cooling efficiency can be increased. However, when the size of the cooling channels 310 are decreased, less cooling water is supplied, so the cooling channel can be decreased.

Further, since the cooling channels 310 are disposed in the segments 130, there is a limit due to the thickness of the segments 130. That is, there may be a problem that it is required to increase the thickness of the segments 130 in order to increase the size of the cooling channels 310. Further, when the size of the cooling channels 310 are increased to increase the cooling efficiency even in consideration of the thickness of the segments 130, the mechanical stability of the cold crucible unit 100 may be deteriorated.

Accordingly, it is required to measure a change in magnetic flux density according to the size of the cooling channels 310. Table 1 shows data obtained by measuring magnetic flux density while changing the size of the cooling channels 310.

The values in Table 1 were measured when the crucible diameter Ø was 200 mm to compare tendency of magnetic flux density according to the shape of the cooling channels 310.

TABLE 1

| R_water | freq (kHz) | Magnetic flux density norm (G), Domain Probe 1 |
| --- | --- | --- |
| 2.0000 | 8.0000 | 99.083 |
| 3.0000 | 8.0000 | 99.084 |
| 4.0000 | 8.0000 | 99.084 |
| 5.0000 | 8.0000 | 99.083 |
| 6.0000 | 8.0000 | 99.084 |
| 7.0000 | 8.0000 | 99.082 |

As shown in Table 1, it was found out that the diameter of the cooling channels 310 does not influence the penetration amount of magnetic flux density. For example, when it is possible to decrease the diameter of the cooling channels 310, it is possible to reduce the thickness D of the segments as much, so a loss of energy that is consumed by the cold crucible 10 can be reduced.

On the contrary, when the diameter of the cooling channels 310 is too small, the cooling efficiency may be decreased, so the cooling channels 310 may expand due to overheating of the cooling water flowing through the cooling channels 310 or the internal pressure of the cooling channels 310 may be remarkably increased by vaporization of some of the cooling water. In this case, cooling lines connected to the cooling channels 310 may explode.

Accordingly, it is preferable to set the diameter of the cooling channels 310 at 8 mm or over to minimize a loss of energy that consumed by the cold crucible 10 and it is preferable to set the diameter of the cooling channels 310 at 15 mm or less to achieve sufficient cooling efficiency.

As a result, it was found out that it is preferable to set the thickness of the cooling channel 310 within 8 to 15 mm in consideration of the thickness of the segments 130 and cooling efficiency.

Referring to FIG. 6 again, the slits 160 spacing the segments 130 may be disposed on the cold crucible unit 100. As described above, the larger the widths dslit of the slits 160, the larger the magnetic flux density in the segments 130 can be. However, when the widths $d_{slit}$ of the slits are increased to increase the magnetic flux density, there may be a problem of leakage of a product or a reactant. Accordingly, it is preferable to set the widths $d_{slit}$ of the slits such that the conditions described above can be satisfied.

Figure 9:
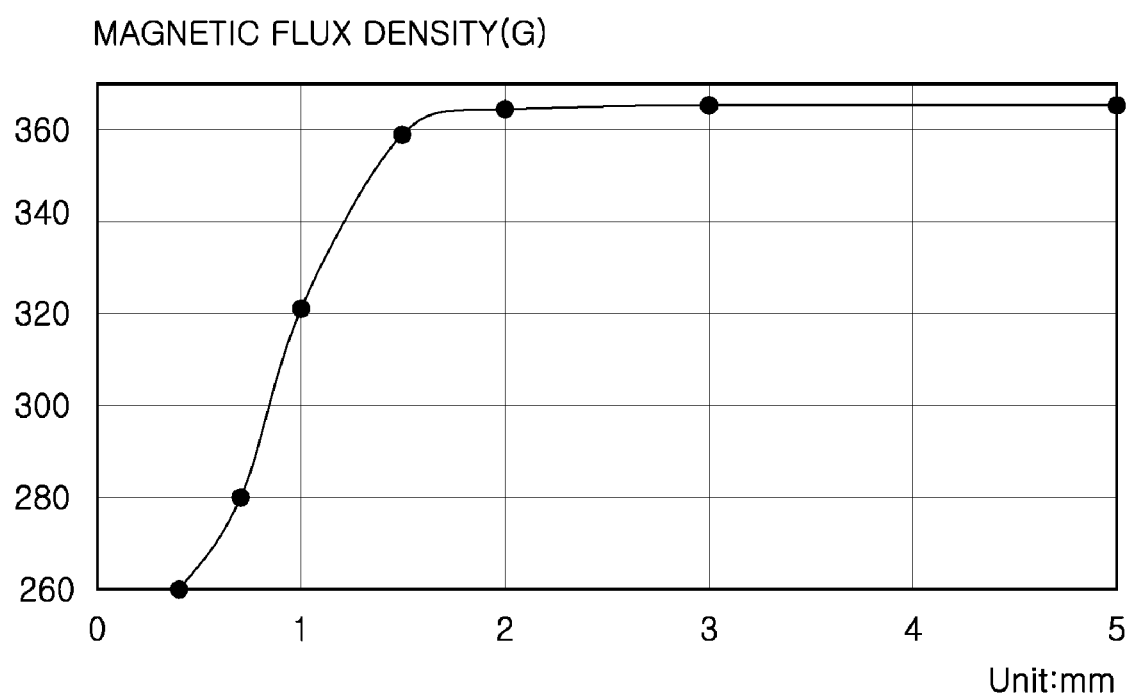
FIG. 9 is a graph showing variation of magnetic flux density according to the widths of slits of the cold crucible structure according to an embodiment of the present invention.

FIG. 9 is a graph showing a change of magnetic flux density according to the widths of the slits of the cold crucible structure according to an embodiment of the present invention.

Variations of magnetic flux density were measured while changing the widths $d_{slit}$ of the slits when the crucible diameter Ø is 200 mm to compare variations of magnetic flux density according to the widths $d_{slit}$ of the slits.

Referring to FIG. 9, the larger the widths $d_{slit}$ of the slits, the larger the magnetic flux density, but it is possible to determine that there is a saturation point.

Optimal widths $d_{slit}$ of the slits can be set through the following Equation 1.

$$d_{slit} \leq 0.3 \times \frac{\phi}{50} \qquad \text{[Equation 1]}$$

where $d_{slit}$ is the width of each of the slits and Ø is the crucible diameter.

For example, when the crucible diameter Ø was 200 mm, 1.2 mm was measured as the optimal width $d_{slit}$ of the slits. This corresponds to the case in which the crucible diameter Ø is 200 mm, and when the crucible diameter Ø is 100 mm or 300 mm, the range of 0.6 to 1.8 mm may be the optimal width of the slits 160 by Equation 1.

However, it is preferable to set the width of the slits 160 within the range of 0.3 mm to 4 mm to increase the penetration ratio of a magnetic field.

Referring to FIG. 6, the slits 160 spacing the segments 130 may be disposed on the cold crucible unit 100. As described above, the larger the number nslit of the slits 160, the larger the magnetic flux density in the segments 130 can be.

However, when the number nslit of the slits is increased to increase the magnetic flux density, the space where the cooling channels 310 can be formed is reduced, so a sufficient cooling flow rate cannot be secured and the cooling efficiency may be deteriorated. Accordingly, it is preferable to dispose the slits in a number that can satisfy conditions described above.

Figure 10:
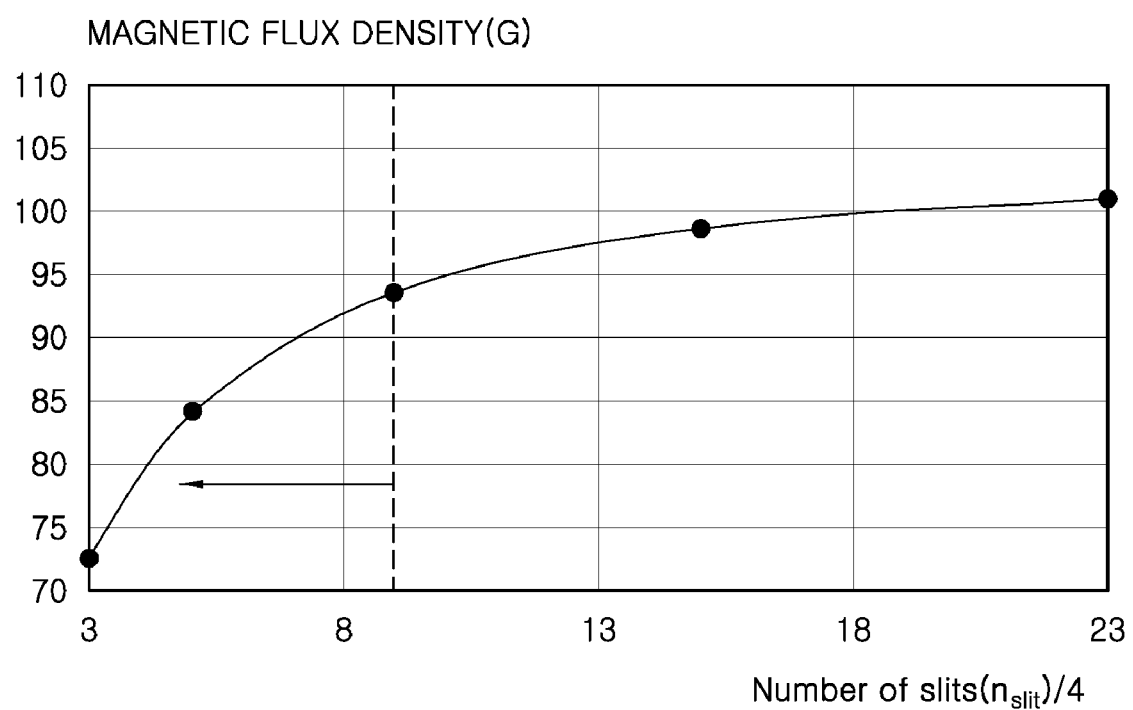
FIG. 10 is a graph showing variation of magnetic flux density according to the number of the slits of the cold crucible structure according to an embodiment of the present invention.

FIG. 10 is a graph showing variation of magnetic flux density according to the number of the slits of the cold crucible structure according to an embodiment of the present invention.

Variations of magnetic flux density were measured while changing the number nslit of the slits in a quarter when the crucible diameter Ø is 200 mm to compare variations of magnetic flux density according to the number nslit of the slits.

Referring to FIG. 10, the larger the number nslit of the slits, the larger the magnetic flux density, but it is possible to determine that there is a saturation point.

The optimal number nslit of the slits can be set through the following Equation 2.

$$n_{slit} \leq \frac{\pi \emptyset}{d_{thick}} \qquad \text{[Equation 2]}$$

$n_{th}$ is the number of slits and $d_{thick}$ is the thickness of the segments 130, and Ø is the crucible diameter.

For example, when the crucible diameter Ø was 200 mm, 36 was measured as the optimal number nslit of the slits. This corresponds to the case in which the crucible diameter Ø is 200 mm, and when the crucible diameter Ø is 300 mm, maximum 54 may be the optimal number nslit of the slits by Equation 2.

However, it is preferable to set the number nslit of the slits in the range of 15 to 60 in order to improve the penetration ratio of a magnetic field and secure mechanical stability and a cooling flow rate.

As described above, it is possible to improve magnetic field penetration efficiency, dissolution efficiency, and energy efficiency together with mechanical/thermal stability of the cold crucible structure 10 according to an embodiment of the present invention by optimizing the thickness D of the segments, the diameter of the cooling channels 310, and the widths $d_{slit}$ and the number of the slits in accordance with the crucible diameter Ø.

Referring to FIGS. 4 and 5 again, the induction coil unit 210 is disposed around the outer side of the cold crucible unit 100 across the longitudinal directions of the segments 130 and the slits 160. It is possible to define the dissolution area (DSA) by overlapping the slits 160, segments 130, and induction coil unit 210 in this way.

The dissolution area (DSA) is an area where a dissolution target can be dissolved, and it is preferable to improve dissolution efficiency by increasing the penetration ratio of magnetic flux.

However, the top cap 110 and the bottom cap 190 provided for mechanical stability of the cold crucible unit 100 are not separated, like the segments 130, but are connected in a ring shape, so they may interfere with penetration of magnetic flux.

Accordingly, the induction coil unit 210 should be spaced apart from the top cap 110 and the bottom cap 190. By disposing the slits 160 such that the top cap 110 and the bottom cap 190 are far from the induction coil unit 210, the penetration ratio of magnetic flux in the cold crucible unit 100 can be improved.

Accordingly, for the dissolution area (DSA), it is preferable to set the length hslit of the slits 130/the height hcoil of the induction coil unit 210 within the range of 1.5 to 3. This is formulated as in the following Equation 3. Equation 3 is as shown below.

$$\frac{h_{slit}}{h_{coil}} 1.5 \sim 3 \qquad \text{[Equation 3]}$$

where hslit is the length of the slits and hcoil is the height of the induction coil unit.

This is described in detail with reference to FIGS. 11 to 13.

Figure 11:
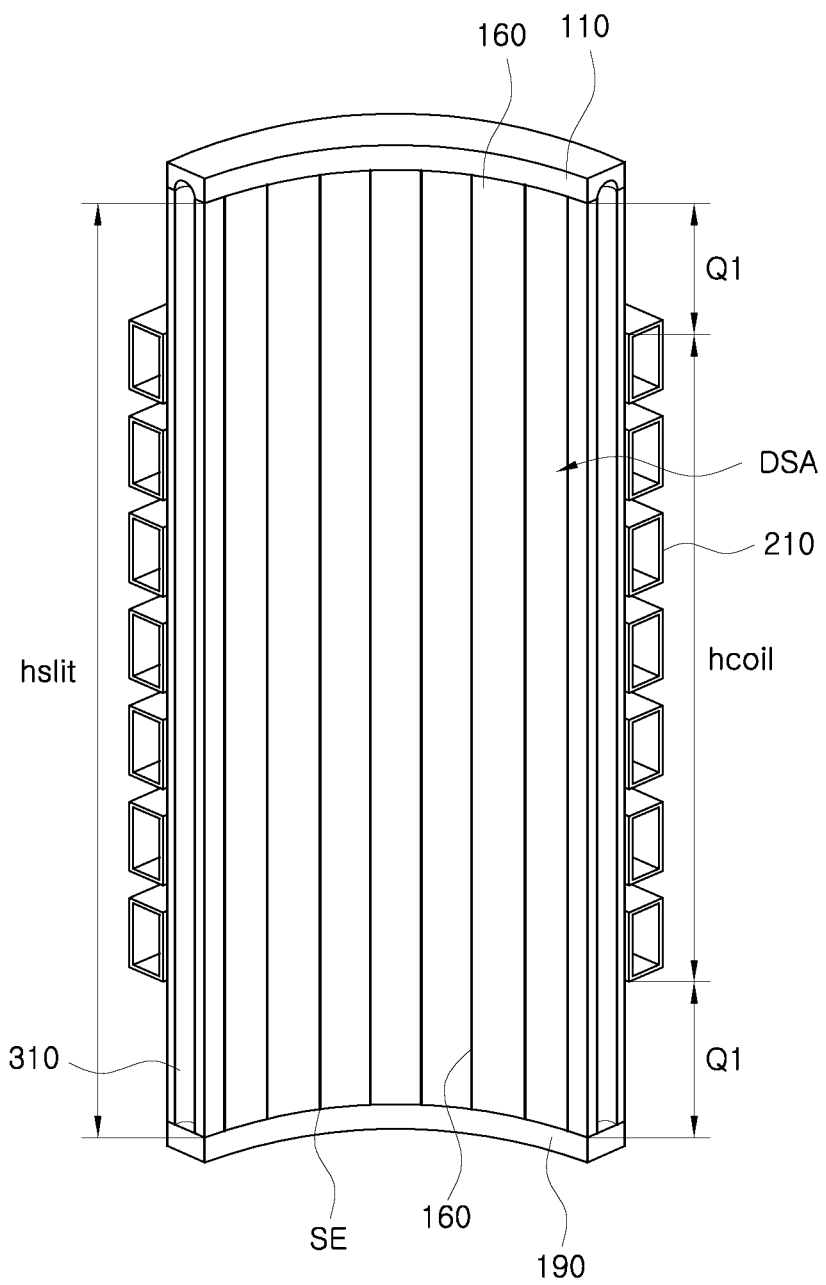
FIG. 11 is a cross-sectional view showing first arrangement of the induction coil unit of the cold crucible structure according to an embodiment of the present invention.

FIG. 11 is a cross-sectional view showing first arrangement of the induction coil unit of the cold crucible structure according to an embodiment of the present invention. FIG. 12 is a cross-sectional view showing second arrangement of the induction coil unit of the cold crucible structure according to an embodiment of the present invention. And FIG. 13 is a graph showing variation of magnetic flux density according to the length of the slits hslit/the height hcoil of the induction coil unit of the cold crucible structure according to an embodiment of the present invention.

First, the dissolution area (DSA) is described in first arrangement when the ratio of the length hslit of the slits/the height hcoil of the induction coil unit set in the range of 1.5 to 3 is 1.5 and in second arrangement when the ratio is 3.

Referring to FIG. 11, assuming that the length hslit of the slits is 10a as a unit length for easy understanding when the ratio of the length hslit of the slits/the height hcoil of the induction coil unit is 1.5, 10a/X=1.5 by Equation 3. X in the equation is the length hslit of the slits.

Accordingly, X is 6.6666a. Accordingly, the remainder is 3.3333a.

The induction coil unit 210 should be disposed far away from the ends SE of the slits to be disposed far away from the top/bottom caps 110 and 190. The shortest distance between the ends SE of the slits and the induction coil unit 210 is referred to as a spacing distance Q1.

In other words, a space of about 3.3333a is defined and the top/bottom caps 110 and 190 are disposed up and down with the induction coil unit 210 therebetween, so they can be disposed with a spacing distance Q1 of 1.66a that is a half of 3.3333a.

When the induction coil unit 210 is closer to any one of the top/bottom caps 110 and 190 to be spaced apart from the top/bottom caps 110 and 190, the spacing distance to the other one is relatively small. Accordingly, the closer one may deteriorate the magnetic flux penetration ratio.

In detail, the magnetic flux penetration ratio can be influenced by any one of the top/bottom cap 110 and 190 disposed close to the induction coil unit 210, so the magnetic flux density may be relatively decreased. Accordingly, the induction coil unit 210 is disposed to correspond to the central area in the longitudinal direction of the segments 130 to improve the magnetic flux penetration ratio. In other words, the induction coil unit 210 can be disposed in the central area of the length from an end to the other end of the slits 160.

Accordingly, the spacing distance Q1 between ends SE of the slits and the induction coil unit 210 and the spacing distance Q1 between the other ends SE of the slits and the induction coil unit 210 can be the same. The spacing distance Q1 between ends SE of the slits and the induction coil unit 210 may mean the shortest distance between the two components.

Figure 12:
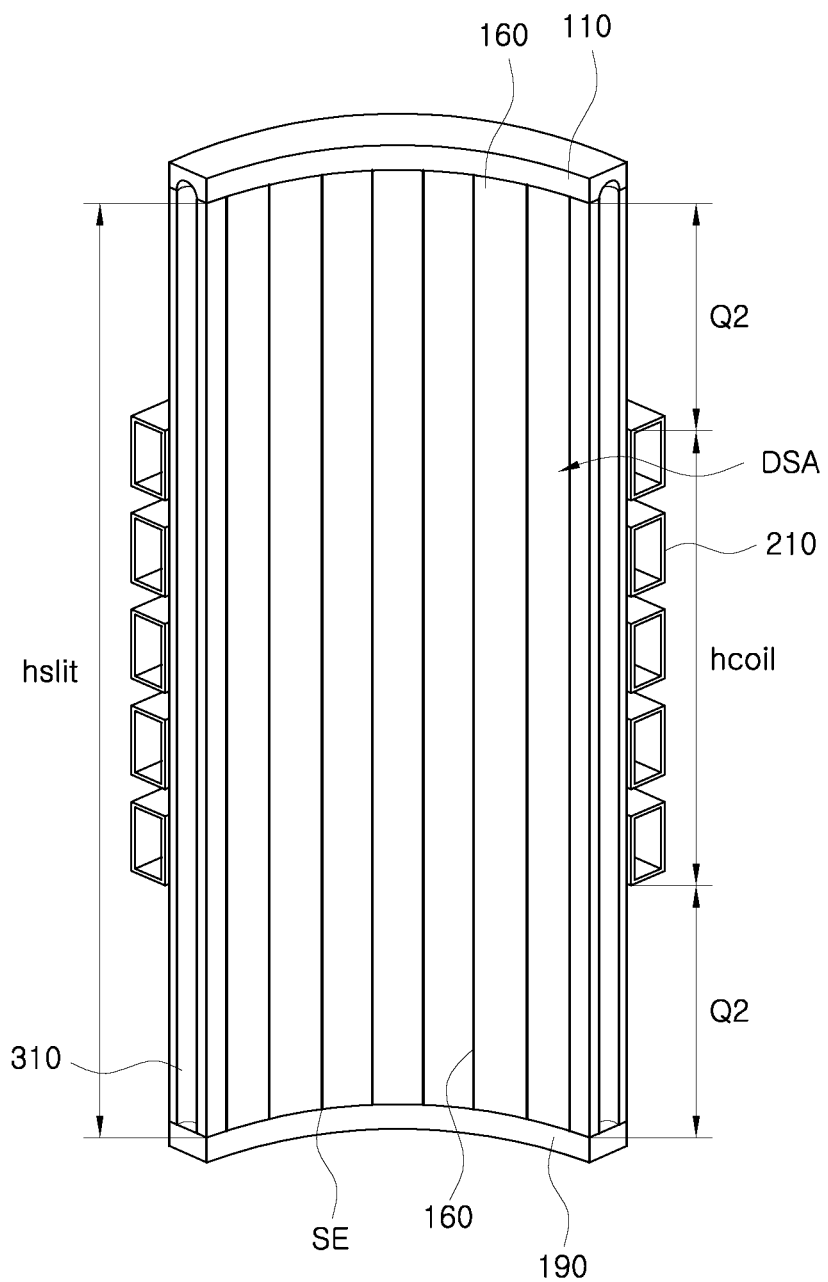
FIG. 12 is a cross-sectional view showing second arrangement of the induction coil unit of the cold crucible structure according to an embodiment of the present invention.

Referring to FIG. 12, when the ratio of the length hslit of the slits/the height hcoil of the induction coil unit is 3, 10a/X=3 by Equation 3. X in the equation is the length hslit of the slits.

Accordingly, X is 3.3333a. Accordingly, the remainder is 6.6666a.

The induction coil unit 210 should be disposed far away from the ends SE of the slits to be disposed far away from the top/bottom caps 110 and 190. In other words, spacing distance of about 6.6666a is defined and the top/bottom caps 110 and 190 are disposed up and down, so they can be disposed with a space of 3.3333a that is a half of 6.6666a.

Accordingly, the induction coil unit 210 is disposed to correspond to the central area in the longitudinal direction of the segments 130. By dividing 6.6666a by 2, 3.3333a is obtained to space the induction coil unit 210 far away from the top/bottom caps 110 and 190.

The induction coil unit 210 should be disposed far away from the ends SE of the slits to be disposed far away from the top/bottom caps 110 and 190. The shortest distance between the ends SE of the slits and the induction coil unit 210 is referred to as a spacing distance Q2.

In other words, a space about 6.666a is defined and the top/bottom caps 110 and 190 are disposed up and down with the induction coil unit 210 therebetween, so they can be disposed with a spacing distance Q2 of 3.333a that is a half of 6.666a.

As described above, the magnetic flux penetration ratio can be influenced by any one of the top/bottom cap 110 and 190 disposed close to the induction coil unit 210, so the magnetic flux density may be relatively decreased. Accordingly, the induction coil unit 210 is disposed to correspond to the central area in the longitudinal direction of the segments 130 to improve the magnetic flux penetration ratio. In other words, the induction coil unit 210 can be disposed in the central area of the length from an end to the other end of the slits 160.

Accordingly, the spacing distance Q2 between ends SE of the slits and the induction coil unit 210 and the spacing distance Q2 between the other ends SE of the slits and the induction coil unit 210 can be the same. The spacing distance Q2 between ends SE of the slits and the induction coil unit 210 may mean the shortest distance between the two components.

Figure 13:
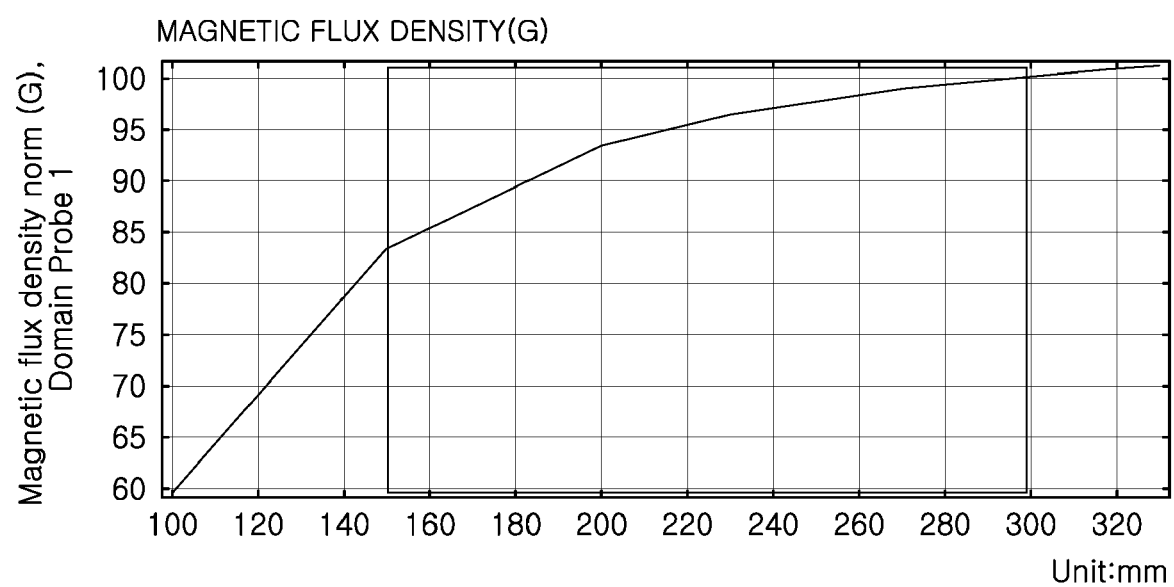
FIG. 13 is a graph showing variation of magnetic flux density according to the length of slits hslit/the height hcoil of the induction coil unit of the cold crucible structure according to an embodiment of the present invention.

Referring to FIG. 13, the magnetic flux over 85 G of the cold crucible 10 according to an embodiment of the present invention was measured as 1.5 to 3. That is, when the height hcoil of the induction coil unit is 100 mm, the length slit of the slits may be 150 to 300 mm. In the figure, the slit hslit of the slits was indicated by h0.

As described above, it can be seen that when the ratio of the length hslit of the slits/the height hcoil of the induction coil unit is 1.5 to 3, the magnetic flux penetration ratio is improved, and the magnetic field penetration efficiency can be improved even regardless of the diameter of the cold crucible.

As described above, it is possible to improve the magnetic field penetration efficiency, dissolution efficiency, and energy efficiency together with mechanical/thermal stability of the cold crucible structure 10 by optimizing arrangement of the induction coil unit 210.

The above description is provided as an exemplary embodiment of the present invention and it should be understood that the present invention may be easily modified in other various ways without changing the spirit or the necessary features of the present invention by those skilled in the art. Therefore, the embodiments described above are only examples and should not be construed as being limitative in all respects. For example, the components described as a single part may be divided and the components described as separate parts may be integrated.

The scope of the present invention is defined by the following claims, and all of changes and modifications obtained from the meaning and range of claims and equivalent concepts should be construed as being included in the scope of the present invention.

REFERENCE SIGNS LIST

10: cold crucible structure
100: cold crucible unit
110: top cap
130: segment
D: segment thickness
160: slit
180: coupling portion
190: bottom cap
195: cooling water hole
210: induction coil unit
DSA: dissolution area
310: cooling channel
380: cooling tube
400: support
Ø: crucible diameter
$d_{slit}$: width of slits
Q: spacing distance.

What is claimed is:

1. A cold crucible structure comprising:
a cold crucible unit including hollow top and bottom caps, a plurality of segments connecting the top cap and the bottom cap, slits each extending from a bottom of the top cap to a top of the bottom cap in an axis direction of the cold crucible unit and being disposed between the segments in a circumference direction of the cold crucible unit, and a reaction area surrounded by the segments, the top and bottom caps being free of the slits; and
an induction coil unit disposed to cover the outer side of the cold crucible unit and disposed across the longitudinal directions of the segments and the slits,
wherein a diameter of the reaction area is defined as a crucible diameter, the crucible diameter is 100 to 300 mm, and a width of each of the slits is defined by the following Equation 1, $$d_{slit} \leq 0.3 \times \frac{\emptyset}{50} (mm) \qquad \text{[Equation 1]}$$

where $d_{slit}$ is the width of each of the slits and Ø is the crucible diameter.

2. The cold crucible structure of claim 1, wherein a thickness of the segments is set in the range of 15 to 25 mm and a number of the slits is defined by the following Equation 2, $$n_{slit} \leq \frac{\pi \emptyset}{d_{thick}} \qquad \text{[Equation 2]}$$

where $n_{slit}$ is the number of slits and $d_{thick}$ is the thickness of the segments, and Ø is the crucible diameter.

3. The cold crucible structure of claim 2, wherein the number of the slits is in the range of 15 to 60.

4. The cold crucible structure of claim 1, wherein the induction coil unit is spaced apart from the top cap and the bottom cap,
the upper end and the lower end of the induction coil unit are spaced apart from the top cap and the bottom cap, respectively,
a ratio of a length of the slit to a height of the induction coil is set in a range of $$\frac{h_{slit}}{h_{coil}} 1.5 \sim 3$$

where $h_{slit}$ is the length of the slits and $h_{coil}$ is the height of the induction coil unit, and
the upper end and the lower end are spaced a predetermined distance apart from the upper portion and the lower portion of the cold crucible, respectively.

5. The cold crucible structure of claim 1, wherein the induction coil unit is disposed at the central area in the longitudinal direction of the segments.

6. The cold crucible structure of claim 1, wherein the cold crucible includes cooling channels disposed in the segments, and
a diameter of the cooling channels is set in a range of 8 to 15 mm.

7. The cold crucible structure of claim 6, further comprising:
a support connected to the bottom cap; and
cooling tubes for supplying cooling water for cooling the segments through the support,
wherein the cooling tubes are connected to the cooling channels.

8. The cold crucible structure of claim 6, wherein the cooling channels include an inlet channel for supplying cooling water and an outlet channel for discharging cooling water.

9. The cold crucible structure of claim 1, wherein a spacing distance between upper ends of the slits and an uppermost one of the induction coils and a spacing distance between lower ends of the slits and a lowermost one of the induction coil unit are same.

10. The cold crucible structure of claim 1, wherein the top cap and the bottom cap each have a continuous wall in the circumferential direction and are integrally formed with the segments.

11. The cold crucible structure of claim 1, wherein a thickness of each of the top cap and the bottom cap is greater than a thickness of each of the segments.

* * * * *